(12) United States Patent
Nagatomo et al.

(10) Patent No.: US 12,451,865 B2
(45) Date of Patent: Oct. 21, 2025

(54) ACOUSTIC WAVE DEVICE

(71) Applicant: Murata Manufacturing Co., Ltd., Nagaokakyo (JP)

(72) Inventors: Sho Nagatomo, Nagaokakyo (JP); Bryant Garcia, Mississauga (CA); Ventsislav Yantchev, Sofia (BG); Patrick Turner, Portola Valley, CA (US); Robert B. Hammond, Rockville, MD (US); Douglas Jachowski, Santa Cruz, CA (US)

(73) Assignee: MURATA MANUFACTURING CO., LTD., Nagaokakyo (JP)

( * ) Notice: Subject to any disclaimer, the term of this patent is extended or adjusted under 35 U.S.C. 154(b) by 162 days.

(21) Appl. No.: 18/510,873

(22) Filed: Nov. 16, 2023

(65) Prior Publication Data

US 2024/0097649 A1    Mar. 21, 2024

Related U.S. Application Data

(63) Continuation of application No. PCT/US2022/029491, filed on May 16, 2022.
(Continued)

(51) Int. Cl.
*H03H 9/205* (2006.01)
*H03H 9/02* (2006.01)

(52) U.S. Cl.
CPC ........ *H03H 9/205* (2013.01); *H03H 9/02015* (2013.01); *H03H 9/02157* (2013.01)

(58) Field of Classification Search
CPC ............... H03H 9/205; H03H 9/02015; H03H 9/02157; H03H 2003/0442; H03H 9/173; H03H 9/174; H03H 9/568; H03H 9/02228
(Continued)

(56) References Cited

U.S. PATENT DOCUMENTS 9,124,243 B2 * 9/2015 Tamasaki ............ H10N 30/8542
2017/0373663 A1    12/2017 Kishimoto et al.
(Continued)

FOREIGN PATENT DOCUMENTS

JP    2018007239 A    1/2018
WO    2021060512 A1    4/2021

OTHER PUBLICATIONS

International Search Report in PCT/US2022/029491, mailed Sep. 7, 2022, 3 pages.

*Primary Examiner* — Jorge L Salazar, Jr.
(74) *Attorney, Agent, or Firm* — ArentFox Schiff LLP

(57) ABSTRACT

An acoustic wave device is provided that includes a piezoelectric layer and first and second resonators. The first resonator includes a first functional electrode and a first dielectric film on the piezoelectric layer. The second resonator includes a second functional electrode and a second dielectric film on the piezoelectric layer. The piezoelectric layer includes first and second resonator portions respectively including portions of the first and second resonators. Moreover, a resonant frequency of the first resonator is lower than that of the second resonator. A thickness of the first resonator portion is greater than that of the second resonator portion, and $ts1/tp1 \leq ts2/tp2$ is satisfied, where $tp1$, $tp2$, $ts1$, and $ts2$ are respectively thicknesses of the first and second resonator portions and the first and second dielectric films.

20 Claims, 9 Drawing Sheets

Related U.S. Application Data

(60) Provisional application No. 63/189,436, filed on May 17, 2021.

(58) Field of Classification Search
USPC .................................. 333/186–188, 193–196
See application file for complete search history.

(56) References Cited

U.S. PATENT DOCUMENTS

| | | |
|---|---|---|
| 2019/0341911 A1 | 11/2019 | Komatsu et al. |
| 2019/0386635 A1 | 12/2019 | Plesski et al. |
| 2020/0083860 A1 | 3/2020 | Ylilammi et al. |
| 2020/0328728 A1 | 10/2020 | Nakagawa et al. |
| 2022/0216392 A1 | 7/2022 | Yamane et al. |

* cited by examiner

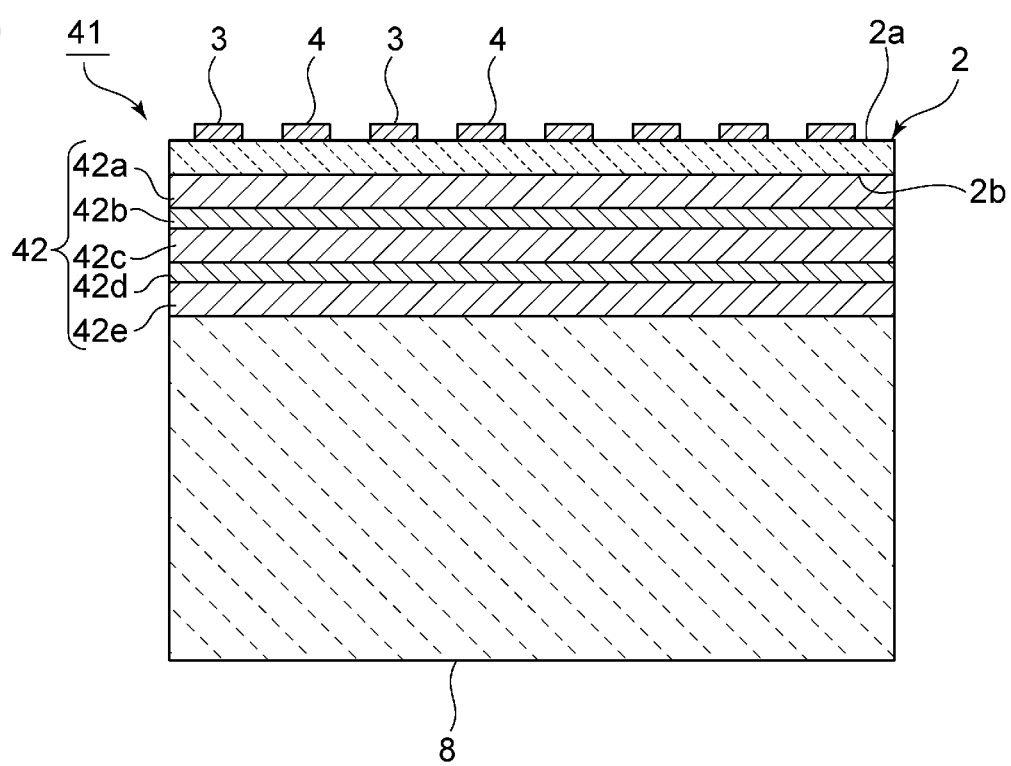

ACOUSTIC WAVE DEVICE

CROSS REFERENCE TO RELATED APPLICATIONS

This application is a continuation of PCT/US2022/029491, filed May 16, 2022, which claims the benefit of priority to U.S. Provisional Patent Application No. 63/189,436 filed on May 17, 2021. The entire contents of each of these applications are hereby incorporated herein by reference.

TECHNICAL FIELD

The present invention relates to an acoustic wave device.

BACKGROUND

Conventionally, acoustic wave devices have been widely used in cellular phone filters and other parts. In recent years, an acoustic wave device using bulk waves in a thickness-shear mode, as described in U.S. Patent Publication No. 2019/0386635 A1, has been proposed. In the acoustic wave device described therein, a pair of electrodes are disposed on a piezoelectric layer. The pair of the electrodes face each other on the piezoelectric layer and are connected to different electric potentials. The acoustic wave device applies an alternating-current voltage between the electrodes to excite bulk waves in the thickness-shear mode.

In some cases, a frequency adjustment film is disposed so as to cover the electrodes on the piezoelectric layer. By trimming the frequency adjustment film to adjust a thickness of the frequency adjustment film, a frequency of an acoustic wave resonator can also be adjusted. If the thickness of the piezoelectric layer has deviated from a target value due to a manufacturing error, for example, the frequency can be adjusted to a desired frequency by adjusting an amount of the trimmed frequency adjustment film.

Moreover, if a plurality of acoustic wave resonators are formed at the piezoelectric layer, desired frequencies for the acoustic wave resonators often differ from each other. Thus, thicknesses of parts of the frequency adjustment film formed for the plurality of the acoustic wave resonators may differ from each other as well.

For acoustic wave resonators that use a thickness resonance mode, such as the thickness-shear mode, degrees to which a deviation in frequency is dependent on the thickness of the frequency adjustment film and on the thickness of the piezoelectric layer may differ. As a result, if the thicknesses of the parts of the frequency adjustment film formed for the plurality of the acoustic wave resonators differ from each other, amounts of the parts of the frequency adjustment film trimmed in response to a deviation of the piezoelectric layer thickness from the target value differ from each other. Further, changes to the amounts of the parts of the frequency adjustment film required to be trimmed, i.e., differences in amount trimmed, differ from each other between the plurality of the acoustic wave resonators. This requires the frequency adjustment film to be trimmed for each acoustic wave resonator.

SUMMARY OF THE INVENTION

Exemplary embodiments of the present invention provide acoustic wave devices that each reduce a variation in a ratio between differences in amounts of portions of a frequency adjustment film trimmed for respective acoustic wave resonators in response to a quantity of a deviation of a piezoelectric layer thickness and that thus facilitate frequency adjustment.

In an exemplary aspect, an acoustic wave device is provided that includes a first resonator including a piezoelectric substrate including a piezoelectric layer, a first functional electrode on the piezoelectric layer, and a first dielectric film on the piezoelectric layer and covering the first functional electrode, and a second resonator sharing the piezoelectric layer with the first resonator. Moreover, the second resonator incudes a second functional electrode on the piezoelectric layer, and a second dielectric film on the piezoelectric layer and covering the second functional electrode. In this aspect, the first resonator and the second resonator are configured to use a thickness resonance mode. The piezoelectric layer includes a first resonator portion and a second resonator portion, a portion of the first resonator being provided in the first resonator portion, a portion of the second resonator being provided in the second resonator portion, a resonant frequency of the first resonator is lower than a resonant frequency of the second resonator and in the piezoelectric layer, and a thickness of the first resonator portion is greater than a thickness of the second resonator portion. According to an exemplary aspect, an inequality $ts1/tp1 \leq ts2/tp2$ is satisfied, where $tp1$ is the thickness of the first resonator portion, $tp2$ is the thickness of the second resonator portion, $ts1$ is a thickness of the first dielectric film, and $ts2$ is a thickness of the second dielectric film.

According to an exemplary aspect, acoustic wave devices are configured to reduce a variation in a ratio between differences in amounts of portions of a frequency adjustment film trimmed for respective acoustic wave resonators in response to a quantity of a deviation of a piezoelectric layer thickness and thus that each facilitate frequency adjustment.

The above and other elements, features, steps, characteristics and advantages of the present invention will become more apparent from the following detailed description of the preferred embodiments with reference to the attached drawings.

BRIEF DESCRIPTION OF THE DRAWINGS

FIG. 15 is a cross-sectional elevation view of an acoustic wave device including an acoustic multilayer film according to an exemplary aspect.

DETAILED DESCRIPTION

Exemplary embodiments of the present invention will now be described with reference to the drawings to clarify the present invention.

It should be appreciated that exemplary embodiments described herein are illustrative and structural elements can be partially replaced or combined between the different embodiments as would be appreciated to one skilled in the art.

Figure 1:
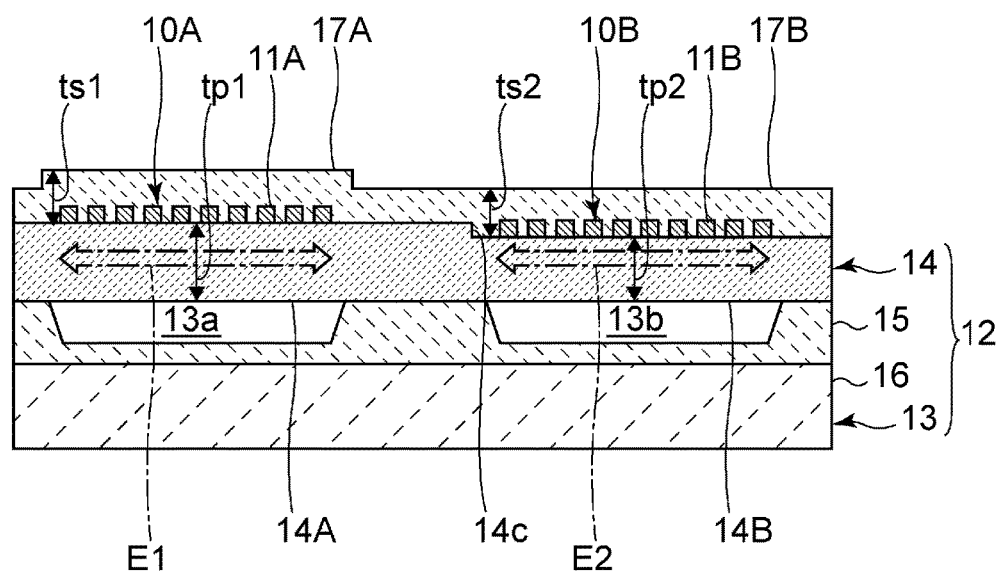
FIG. 1 is a cross-sectional elevation view of an acoustic wave device according to a first exemplary embodiment.

FIG. 1 is a cross-sectional elevation view of an acoustic wave device according to a first exemplary embodiment.

As shown in FIG. 1, an acoustic wave device 10 includes a piezoelectric substrate 12. A first resonator 10A and a second resonator 10B are provided on the piezoelectric substrate 12. Both the first resonator 10A and the second resonator 10B are acoustic wave resonators. The acoustic wave device 10 can, for example, be used as a portion of a filter device. In the present preferred embodiment, the first resonator 10A is a parallel arm resonator. The second resonator 10B is a serial arm resonator. However, a number of resonators in the acoustic wave device 10 is not limited to two, but may be three or more resonators of a filter device in an alternative aspect. Thus, the acoustic wave device 10 itself may be a filter device.

The piezoelectric substrate 12 includes a support 13 and a piezoelectric layer 14. In the present preferred embodiment, the support 13 includes a support substrate 16 and an insulating layer 15 (e.g., a dielectric layer). The insulating layer 15 is disposed on the support substrate 16. The piezoelectric layer 14 is disposed on the insulating layer 15. However, the support 13 may include only the support substrate 16.

A material for the support substrate 16 may be a semiconductor such as silicon or ceramics such as aluminum oxide, for example. A material for the insulating layer 15 may be an appropriate dielectric such as, for example, silicon oxide or tantalum pentoxide. The piezoelectric layer 14 is, for example, a layer of lithium tantalate, such as a layer of $LiTaO_3$ or a layer of lithium niobate such as a layer of $LiNbO_3$.

The support 13 includes a cavity 13a. More specifically, the insulating layer 15 includes a hollow space configured as a cavity. The piezoelectric layer 14 is disposed on the insulating layer 15 so as to close the hollow. As a result, the cavity 13a is provided. Similarly, a cavity 13b is provided. The cavity 13a and the cavity 13b may be disposed in both the insulating layer 15 and the support substrate 16 or may be provided only in the support substrate 16 in alternative aspects. The cavity 13a and the cavity 13b may each be defined by a through-hole in the support 13.

A first interdigital transducer (IDT) electrode 11A is disposed on the piezoelectric layer 14 to define and function as a first functional electrode. As a result, the first resonator 10A is provided. A second IDT electrode 11B is disposed on the piezoelectric layer 14 to define and function as a second functional electrode. As a result, the second resonator 10B is provided. The first resonator 10A and the second resonator 10B share the piezoelectric layer 14. It is noted that all the first IDT electrode 11A and second IDT electrode 11B are disposed on a top surface of piezoelectric layer 14, in an alternative aspect, the first IDT electrode 11A and second IDT electrode 11B can be disposed on a bottom surface of piezoelectric layer 14 facing the respective cavities, for example.

In any event, the piezoelectric layer 14 includes a first resonator portion 14A and a second resonator portion 14B. More specifically, the first resonator portion 14A is a portion of the piezoelectric layer 14 in which a portion of the first resonator 10A is provided. More specifically, as shown in an arrow E1 in FIG. 1, the first resonator portion 14A is a portion of the piezoelectric layer 14 on which the first IDT electrode 11A is disposed. The second resonator portion 14B is a portion of the piezoelectric layer 14 in which a portion of the second resonator 10B is provided. More specifically, as shown in an arrow E2 in FIG. 1, the second resonator portion 14B is a portion of the piezoelectric layer 14 on which the second IDT electrode 11B is disposed. In the present embodiment, as shown in FIG. 1, the piezoelectric layer 14 includes a step 14c. Consequently, a thickness of the first resonator portion 14A is greater than a thickness of the second resonator portion 14B in this exemplary aspect.

In regard to each of the first IDT electrode 11A and the second IDT electrode 11B, a direction in which electrode fingers adjacent to each other are arranged face-to-face is an electrode-finger face-to-face direction. A range of the first resonator portion 14A in the electrode-finger face-to-face direction is a range extending from a portion of the first IDT electrode 11A at which the electrode finger on one end is disposed to a portion of the first IDT electrode 11A at which the electrode finger on another end is disposed in the electrode-finger face-to-face direction. Similarly, a range of the second resonator portion 14B in the electrode-finger face-to-face direction is a range extending from a portion of the second IDT electrode 11B at which the electrode finger on one end is disposed to a portion of the second IDT electrode 11B at which the electrode finger on another end is disposed in the electrode-finger face-to-face direction.

As shown at least a portion of the first IDT electrode 11A overlaps the cavity 13a in a plan view. Similarly, at least a portion of the second IDT electrode 11B overlaps the cavity 13b. However, the first IDT electrode 11A and the second IDT electrode 11B may overlap a common cavity in the plan view. In the present specification, the plan view is a view in a direction from an upper side of FIG. 1. In FIG. 1, for example, of the support substrate 16 and the piezoelectric layer 14, the piezoelectric layer 14 is one located above the other.

According to the exemplary aspect, the cavity 13a is a first acoustic reflector. Similarly, the cavity 13b is a second acoustic reflector in the exemplary aspect. The first acoustic reflector and the second acoustic reflector are configured to suitably confine acoustic waves to a side adjacent to the piezoelectric layer 14. This is achieved as long as at least one cavity is provided. The first acoustic reflector and the second acoustic reflector may be integrated together in an alternative aspect. Alternatively, an acoustic multilayer film, such as a Bragg reflector or mirror, described later may be provided instead of the cavities.

The first resonator 10A includes a first dielectric film 17A. The first dielectric film 17A is disposed on the piezoelectric layer 14 so as to cover the first IDT electrode 11A. The second resonator 10B includes a second dielectric film 17B. The second dielectric film 17B is disposed on the piezoelectric layer 14 so as to cover the second IDT electrode 11B.

According to the exemplary aspect, the first dielectric film 17A and the second dielectric film 17B are frequency adjustment films. Frequency of the first resonator 10A can be adjusted by trimming the first dielectric film 17A and adjusting a thickness of the first dielectric film 17A. Similarly, frequency of the second resonator 10B can be adjusted by adjusting a thickness of the second dielectric film 17B.

A material for the first dielectric film 17A and the second dielectric film 17B can be silicon oxide or silicon nitride, for example.

In the description below and for purposes of this disclosure, a resonant frequency of the first resonator 10A is represented by fr1, and a resonant frequency of the second resonator 10B is represented by fr2. The thickness of the first resonator portion 14A of the piezoelectric layer 14 is tp1, and the thickness of the second resonator portion 14B is tp2. The thickness tp1 and the thickness tp2 are collectively referred to as a resonator portion thickness tp. For purposes of this disclosure, the thickness of the first dielectric film 17A is ts1, and the thickness of the second dielectric film 17B is ts2. The thickness ts1 and the thickness ts2 are collectively referred to as a dielectric film thickness ts. A quantity of a deviation of a thickness of the piezoelectric layer 14 is Δtp, and a difference in amount of a trimmed portion of either of the first dielectric film 17A and the second dielectric film 17B is Δts. Specifically, the deviation quantity Δtp is a quantity of the deviation of the thickness of the piezoelectric layer 14 from a target value. Specifically, the difference Δts in amount of the trimmed portion is a difference between an amount of the portion trimmed when the thickness of the piezoelectric layer 14 is the target value and an amount of the portion trimmed when the thickness of the piezoelectric layer 14 is deviated from the target value.

Moreover, a ratio of the difference Δts in amount of the trimmed portion to the deviation quantity Δtp is Δts/Δtp.

According to an exemplary aspect, the thickness ts1 of the first dielectric film 17A is a distance between a portion of a main surface of the piezoelectric layer 14 on which the first IDT electrode 11A is not disposed and a surface of the first dielectric film 17A.

Characteristics of the exemplary embodiment are fr1<fr2, tp1>tp2, and ts1/tp1≤ts2/tp2. This configuration reduces a variation in Δts/Δtp between the first resonator 10A and the second resonator 10B. Moreover, this configuration allows the first dielectric film 17A and the second dielectric film 17B to be readily trimmed and facilitates frequency adjustment, which contributes to improved productivity. Details of the technical advantage will be described below.

An acoustic wave device having the configuration of the exemplary embodiment and an acoustic wave device of a comparative example were prepared to compare Δts/Δtp between them. More specifically, acoustic wave devices in an example 1 and an example 2 were prepared as acoustic wave devices having the configuration of the exemplary embodiment. In the example 1, the inequality, fr1<fr2, the inequality, tp1>tp2, and the equation, ts1/tp1=ts2/tp2, were satisfied. In the example 2, the inequality, fr1<fr2, the inequality, tp1>tp2, and the equation, ts1/tp1<ts2/tp2, were satisfied. Meanwhile, in the comparative example, the inequality, fr1<fr2, the equation, tp1=tp2, and the inequality, ts1/tp1>ts2/tp2 were satisfied. Configurations of first resonators in the example 1, the example 2, and the comparative example were the same or substantially the same as one another. On the other hand, second resonators in the example 1, the example 2, and the comparative example were different from one another in configuration.

Table 1 shows ratios Δts/Δtp in the example 1, the example 2, and the comparative example. In addition to the ratios above, Table 1 shows piezoelectric layer resonator portion thicknesses tp, dielectric film thicknesses ts, and ratios ts/tp in the example 1, the example 2, and the comparative example.

TABLE 1

|  | Resonator | tp | ts | ts/tp | Δts/Δtp |
|---|---|---|---|---|---|
| Example 1 ts1/tp1 = ts2/tp2 | First resonator (shunt) | tp1 = 373 | ts1 = 133 | ts1/tp1 = 0.36 | −1.08 |
|  | Second resonator (series) | tp2 = 317 | ts2 = 113 | ts2/tp2 = 0.36 | −1.09 |
| Example 2 ts1/tp1 < ts2/tp2 | First resonator (shunt) | tp1 = 373 | ts1 = 133 | ts1/tp1 = 0.36 | −1.08 |
|  | Second resonator (series) | tp2 = 270 | ts2 = 144 | ts2/tp2 = 0.53 | −0.95 |
| Comparative example ts1/tp1 > ts2/tp2 | First resonator (shunt) | tp1 = 373 | ts1 = 133 | ts1/tp1 = 0.36 | −1.08 |
|  | Second resonator (series) | tp2 = 373 | ts2 = 43 | ts2/tp2 = 0.12 | −1.79 |

In the comparative example, as shown in Table 1, the ratios Δts/Δtp greatly differ from each other between the first resonator and the second resonator. Thus, in the comparative example, the variation in Δts/Δtp is substantial between the first resonator and the second resonator. In contrast to that, it is observed in each of the example 1 and the example 2 that the variation in Δts/Δtp is reduced between the first resonator and the second resonator.

Figure 2:
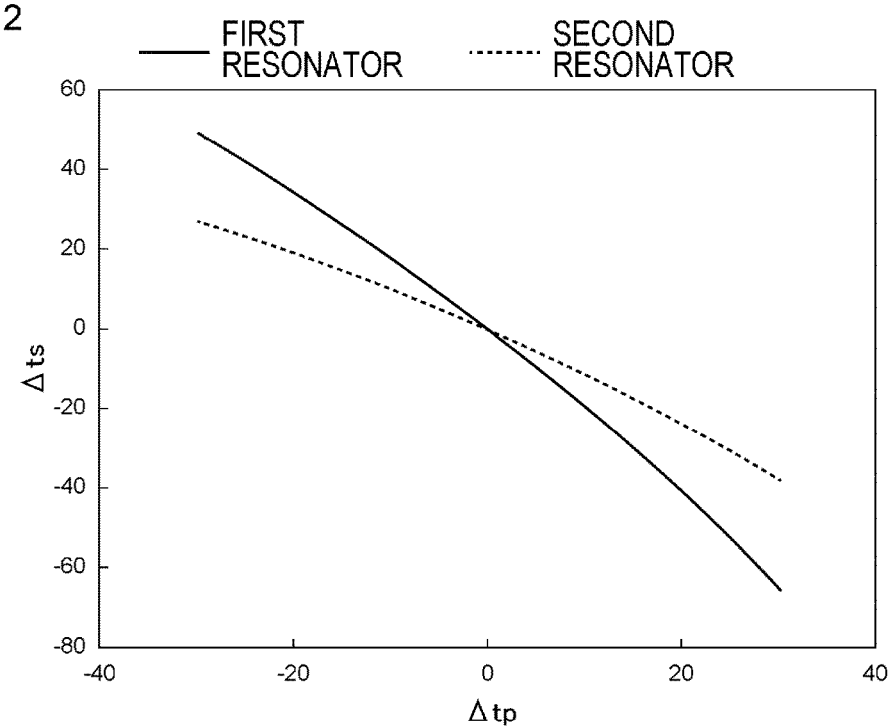
FIG. 2 is a graph showing a relationship between a quantity of a deviation $\Delta tp$ of a piezoelectric layer thickness and a difference $\Delta ts$ in amount of a trimmed portion of either of a first dielectric film and a second dielectric film in a comparative example.

With reference to FIG. 2, a relationship between the quantity of the deviation Δtp of a piezoelectric layer thickness and the difference Δts in amount of the trimmed portion of either of a first dielectric film and a second dielectric film in the comparative example will be illustrated in more specific terms.

In particular, FIG. 2 is a graph showing a relationship between the quantity of the deviation Δtp of a piezoelectric layer thickness and the difference Δts in amount of the trimmed portion of either of the first dielectric film and the second dielectric film in the comparative example.

As shown in FIG. 2, when the quantity of the deviation Δtp of the piezoelectric layer thickness from the target value varies, the difference Δts in amount of the portion required to be trimmed from the first dielectric film of the first resonator varies. The same applies to the second dielectric film of the second resonator. In the comparative example, even if the deviation quantity Δtp is shared, the difference Δts in amount of the portion trimmed from the first dielectric film and the difference Δts in amount of the portion trimmed from the second dielectric film differ from each other. In other words, a substantial variation occurs in Δts/Δtp between the first resonator and the second resonator. Thus, if the first dielectric film and the second dielectric film are trimmed at the same time, the frequency of the first resonator or the second resonator may substantially deviate from a desired frequency.

In contrast to that, the exemplary embodiment shown in FIG. 1, and as described above, reduces the variation in Δts/Δtp between the first resonator 10A and the second resonator 10B. Thus, when the first dielectric film 17A and the second dielectric film 17B in the first resonator 10A and the second resonator 10B are trimmed at the same time, frequencies of both the resonators can be suitably adjusted. This configuration contributes to improved productivity.

Preferably, the equation, ts1/tp1=ts2/tp2, is satisfied as in the example 1 described above. This effectively reduces the variation in Δts/Δtp between the first resonator 10A and the second resonator 10B.

In the exemplary embodiment, the first dielectric film 17A and the second dielectric film 17B are made of a dielectric of the same or substantially the same type. Moreover, the first dielectric film 17A and the second dielectric film 17B can be integrated together. The first dielectric film 17A and the second dielectric film 17B may be disposed separately from each other in an alternative aspect. Yet further, there may be a portion where no dielectric film is disposed between the first dielectric film 17A and the second dielectric film 17B.

Figure 3:
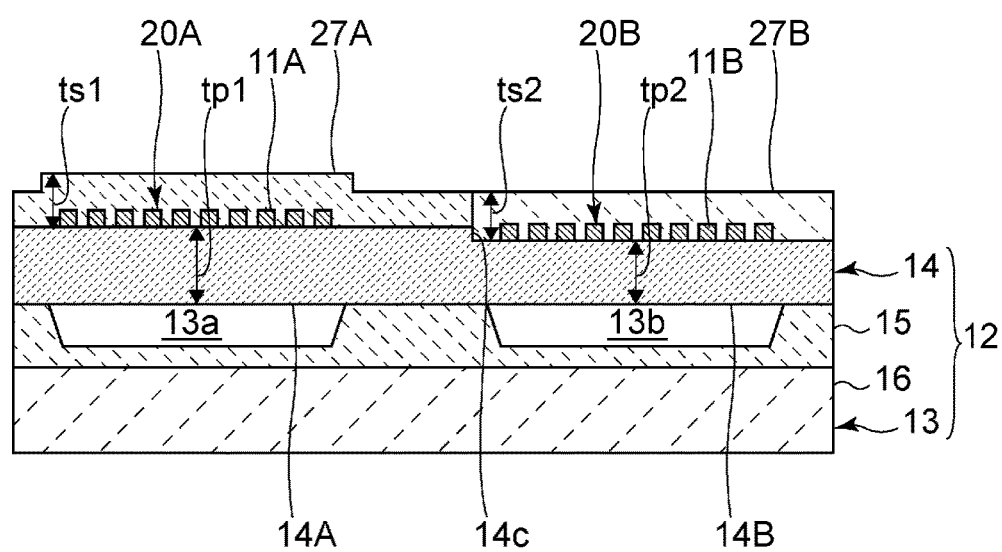
FIG. 3 is a cross-sectional elevation view of an acoustic wave device according to a modification of the first exemplary embodiment.

It is noted that the first dielectric film 17A and the second dielectric film 17B may not be made of a dielectric of the same or substantially the same type. In a modification of the first exemplary embodiment shown in FIG. 3, a first dielectric film 27A of a first resonator 20A and a second dielectric film 27B of a second resonator 20B are made of dielectrics of different types, for example. Even this case, in the same or similar way as the first exemplary embodiment, reduces a variation in Δts/Δtp between the first resonator 20A and the second resonator 20B and thus facilitates frequency adjustment.

In the first exemplary embodiment and the modification thereof, the first resonator and the second resonator are configured to use bulk waves, for example, in a thickness-shear mode such as a first order thickness-shear mode. However, the first resonator and the second resonator may be configured to use a thickness resonance mode without being limited to use of the thickness-shear mode in alternative aspects.

Details of the thickness-shear mode will be described below. The first IDT electrode 11A and the second IDT electrode 11B described above have an IDT electrode configuration described later. A support in an example described below is equivalent to a support substrate in an exemplary aspect.

Figure 4A:
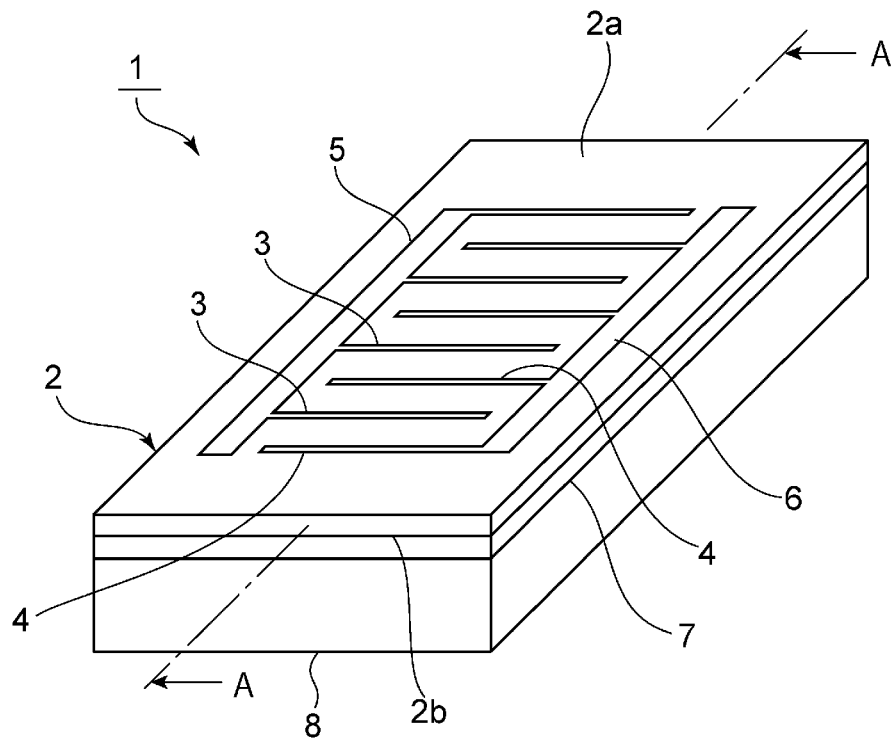
FIG. 4A is a schematic perspective view showing an external appearance of an acoustic wave device using bulk waves in a thickness-shear mode and FIG. 4B is a plan view showing an electrode structure on a piezoelectric layer.
Figure 4B:
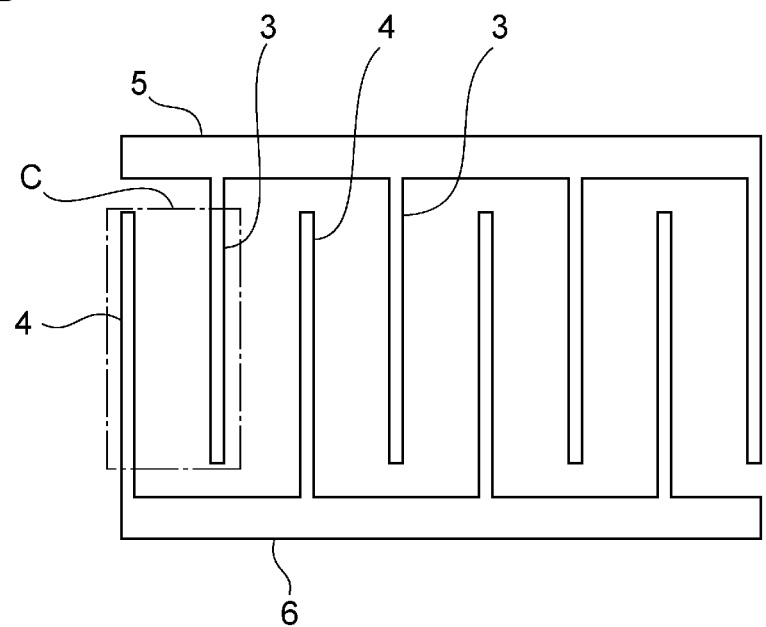
Figure 5:
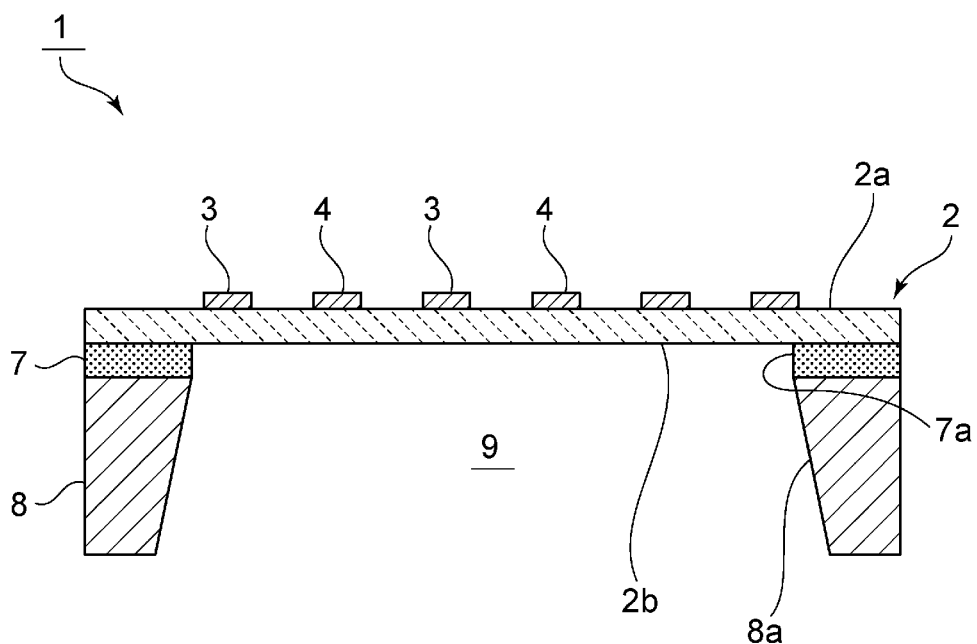
FIG. 5 is a cross-sectional view taken along line A-A of FIG. A4A.

FIG. 4A is a schematic perspective view showing an external appearance of an acoustic wave device using bulk waves in a thickness-shear mode and FIG. 4B is a plan view showing an electrode structure on a piezoelectric layer. FIG. 5 is a cross-sectional view taken along line A-A of FIG. 4A.

As shown, an acoustic wave device 1 includes a piezoelectric layer 2 made of, for example, $LiNbO_3$. The piezoelectric layer 2 may be made of, for example, $LiTaO_3$. A cut angle of the $LiNbO_3$ or $LiTaO_3$ is a Z-cut angle but may be a rotary Y-cut angle or an X-cut angle. A thickness of the piezoelectric layer 2 is not particularly limited but, for example, should preferably be from about 40 nm to about 1000 nm inclusive and should more preferably be from about 50 nm to about 1000 nm inclusive to effectively excite waves in the thickness-shear mode. The piezoelectric layer 2 includes first and second main surfaces 2a, 2b opposed to each other. Moreover, an electrode 3 and an electrode 4 are disposed on the first main surface 2a. For purposes of this disclosure, the electrode 3 is an example of a "first electrode" and the electrode 4 is an example of a "second electrode". In FIGS. 4A and 4B, a plurality of the electrodes 3 are connected to a first bus bar 5. A plurality of the electrodes 4 are connected to a second bus bar 6. The plurality of the electrodes 3 are each interposed between the plurality of the adjacent electrodes 4, and vice versa. The electrode 3 and the electrode 4 each have a rectangular or substantially rectangular shape and a length direction. In a direction orthogonal or substantially orthogonal to the length direction, the electrode 3 and the electrode 4 adjacent to each other are face-to-face. Both the electrodes 3, 4 length direction and the direction orthogonal or substantially orthogonal to the electrodes 3, 4 length direction are directions intersecting with a thickness direction of the piezoelectric layer 2. Thus, the electrode 3 and the electrode 4 adjacent to each other are face-to-face in a direction intersecting with the piezoelectric layer 2 thickness direction. The electrodes 3, 4 length direction may be interchanged with the direction orthogonal or substantially orthogonal to the electrodes 3, 4 length direction shown in FIGS. 4A and 4B. In other words, the electrodes 3, 4 may be extended in a direction in which the first bus bar 5 and the second bus bar 6 are extended in FIGS. 4A and 4B. In this case, the first bus bar 5 and the second bus bar 6 are extended in a direction in which the electrodes 3, 4 are extended in FIGS. 4A and 4B. The electrode 3 connected to a first electric potential and the electrode 4 connected to a second electric potential that are adjacent to each other and define a structure of a pair are disposed in a plurality of pairs in a direction orthogonal or substantially orthogonal to the electrodes 3, 4 length direction. Moreover, it is noted that the electrode 3 and the electrode 4 that are adjacent to each other herein do not refer to the electrode 3 and the electrode 4 that are in immediate contact with each other, but instead refer to the electrode 3 and the electrode 4 that are disposed at a distance from each other. When the electrode 3 and the electrode 4 are adjacent to each other, any electrode, including other electrodes 3, 4, that is connected to a hot electrode or a ground electrode is not disposed between the electrode 3 and the electrode 4. It is also noted that a number of the pairs is not necessarily an integer, and the electrodes may be, for example, in pairs such as 1.5 pairs or 2.5 pairs in alternative aspects. Preferably, a distance between centers of the electrodes 3, 4, in other words an electrode-to-electrode interval (also referred to as a "pitch"), is, for example, in a range from about 1 μm to about 10 μm inclusive. A width of electrode 3, 4, in other words a dimension of each electrode in the direction in which the electrodes 3, 4 are face-to-face, should, for example, preferably range from about 50 nm to about 1000 nm inclusive and should more preferably range from about 150 nm to about 1000 nm inclusive. The distance between the centers of the electrodes 3, 4 is a distance from a center of a dimension (e.g., a width) of the electrode 3 in the direction orthogonal or substantially orthogonal to the electrode 3 length direction to a center of a dimension (e.g., a width) of the electrode 4 in the direction orthogonal to the electrode 4 length direction.

Since the acoustic wave device 1 includes the piezoelectric layer that has a Z-cut angle, the direction orthogonal or substantially orthogonal to the electrodes 3, 4 length direction is a direction orthogonal or substantially orthogonal to a direction in which the piezoelectric layer 2 exhibits polarization. It should be appreciated that this configuration need not apply to cases where the piezoelectric layer 2 is a piezoelectric layer that has another cut angle. It is also noted that the term "orthogonal", as used herein, is not limited to exact orthogonal, but also refers to substantially orthogonal (the angle that the direction orthogonal to the electrodes 3, 4 length direction forms with the polarization direction is, for example, in a range of about 90°±10°).

A support 8 is stacked to the second main surface 2b of the piezoelectric layer 2 through an insulating layer 7. As shown in FIG. 5, the insulating layer 7 and the support 8 have a frame shape and include through-holes 7a, 8a, respectively. As a result, a cavity 9 is provided. The cavity 9 is disposed to avoid hindering vibration of an excitation region C in the piezoelectric layer 2. Thus, the support 8 to is stacked the second main surface 2b through the insulating layer 7 such that the support 8 is located at a position that does not overlap a portion in which at least one pair of the electrodes 3, 4 are disposed. The insulating layer 7 may not be disposed in an alternative aspect. Thus, the support 8 can be directly or indirectly stacked to the second main surface 2b of the piezoelectric layer 2.

According to an exemplary aspect, the insulating layer 7 is made of, for example, silicon oxide. However, it is noted that the insulating layer may be made of another suitable insulating material, such as silicon oxynitride and alumina, other than silicon oxide, for example. The support 8 is made of, for example, Si. A surface of the Si adjacent to the piezoelectric layer 2 may have a plane orientation of (100) or (110), or the plane orientation may be (111). Preferably, the Si of the support 8 displays high resistance and has a resistivity of, for example, about 4 kΩcm or greater. However, it should be appreciated that the support 8 may be made of another suitable insulating material or semiconductor material, for example.

Moreover, a material for the support 8 may be a piezoelectric substance such as aluminum oxide, lithium tantalate, lithium niobate, and crystal, ceramics such as alumina, magnesia, sapphire, silicon nitride, aluminum nitride, silicon carbide, zirconia, cordierite, mullite, steatite, and forsterite, a dielectric such as diamond and glass, or a semiconductor such as gallium nitride, for example.

The plurality of the electrodes 3, 4 and the first and second bus bars 5, 6 described above are made of a suitable metal or an alloy such as Al or an alloy of Al and Cu, for example. According to the exemplary embodiment, the electrodes 3, 4 and the first and second bus bars 5, 6 have a laminated structure in which an Al film is disposed on a Ti film. An adhesion layer other than the Ti film may be used.

In operation, an alternating-current (AC) voltage is applied between the plurality of the electrodes 3 and the plurality of the electrodes 4 to drive the acoustic wave device. More specifically, an AC voltage is applied between the first bus bar 5 and the second bus bar 6. This configuration and operation enables a resonance characteristic using thickness-shear mode bulk waves excited in the piezoelectric layer 2. In the acoustic wave device 1, d/p is, for example, less than or equal to about 0.5 where d represents the thickness of the piezoelectric layer 2 and p represents the distance between the centers of any pair of the adjacent electrodes 3, 4 of the plurality of the pairs of the electrodes 3, 4. Moreover, this configuration and operation enables bulk waves in the thickness-shear mode to be effectively excited, resulting in a satisfactory resonance characteristic. Preferably, d/p is, for example, less than or equal to about 0.24, and this enables a more satisfactory resonance characteristic.

Figure 6A:
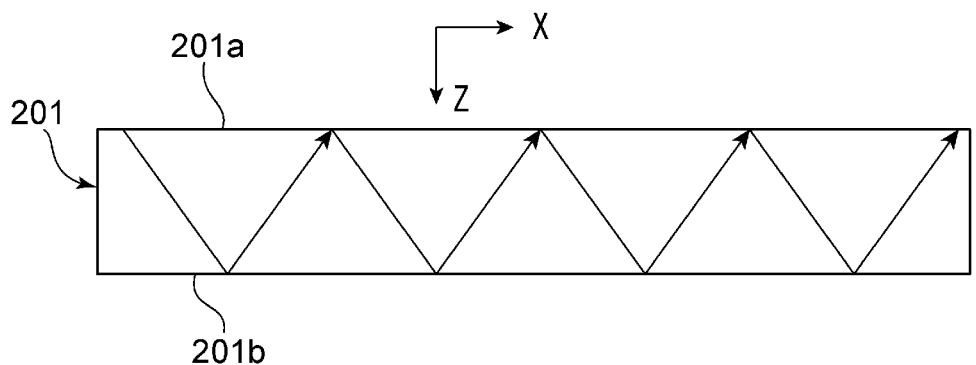
FIG. 6A is a schematic cross-sectional elevation view for illustrating Lamb waves propagating through a piezoelectric film in an acoustic wave device and FIG. 6B is a schematic cross-sectional elevation view for illustrating thickness-shear mode bulk waves propagating through a piezoelectric film in an acoustic wave device.
Figure 6B:
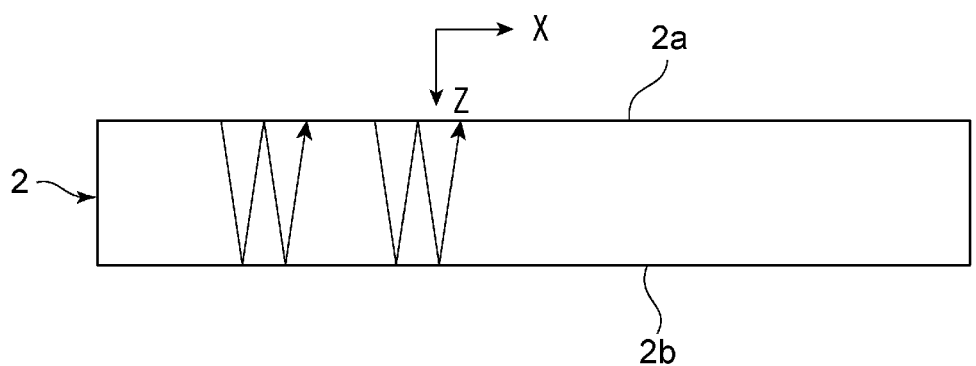

The acoustic wave device 1 has the configuration described above. Thus, a reduction in Q-value is less likely to occur even if the number of the pairs of the electrodes 3, 4 is decreased to reduce the size of the device. This is because of slight propagation loss that is caused if a number of electrode fingers on both sides of reflectors is decreased. It is noted that the number of the electrode fingers can be decreased since the acoustic wave device uses thickness-shear mode bulk waves. With reference to FIGS. 6A and 6B, a difference between Lamb waves used in an acoustic wave device and bulk waves in the thickness-shear mode will be described.

FIG. 6A is a schematic cross-sectional elevation view for illustrating Lamb waves propagating through a piezoelectric film in an acoustic wave device, as described in JP 2012-257019 A. In this example, a wave propagates in a piezoelectric film 201 as indicated by arrows. A first main surface 201a and a second main surface 201b of the piezoelectric film 201 are opposed to each other, and a thickness direction connecting the first main surface 201a and the second main surface 201b is a Z-direction. An X-direction is a direction in which electrode fingers of IDT electrodes are arranged. As shown in FIG. 6A, Lamb waves propagate in the X-direction as indicated by the illustration. Although the piezoelectric film 201 as a whole vibrates because the wave is a plate wave, the waves propagate in the X-direction. Thus, with reflectors disposed on both sides, the acoustic wave device has a resonance characteristic. As a result, wave propagation loss occurs, and the Q-value decreases if the device is downsized, i.e., the number of pairs of the electrode fingers is decreased.

In contrast, in the acoustic wave device 1, as shown in FIG. 6B, vibration displacement appears in a direction of thickness-shear. Thus, waves substantially propagate in the Z-direction, a direction connecting the first main surface 2a and the second main surface 2b of the piezoelectric layer 2, and resonate. In other words, a component of the waves in the X-direction is significantly smaller than a component of the waves in the Z-direction. The propagation of the waves in the Z-direction causes the resonance characteristic. Thus, propagation loss is less likely to occur even if the number of the electrode fingers of the reflectors is decreased. Moreover, a reduction in Q-value is less likely to occur even if the number of the pairs of the electrodes 3, 4 is decreased to reduce the size of the device.

Figure 7:
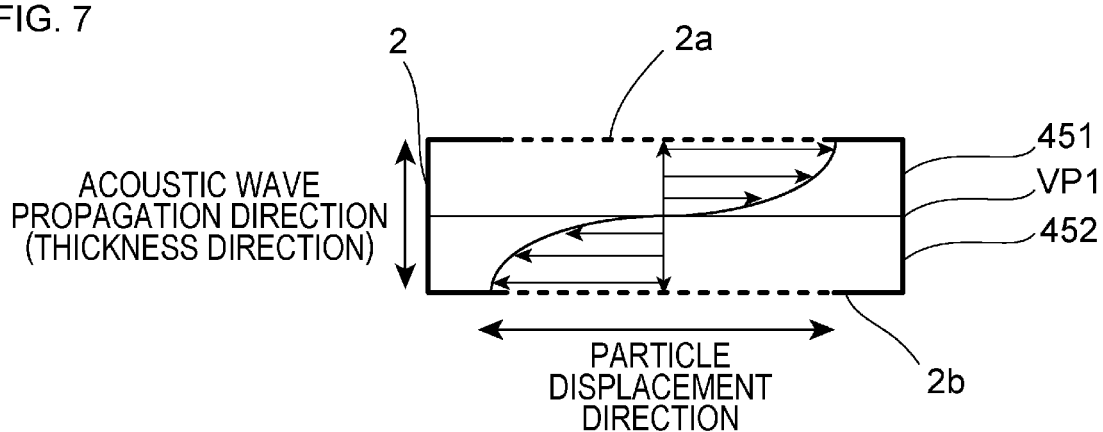
FIG. 7 shows a direction of an amplitude of bulk waves in a thickness-shear mode.

As shown in FIG. 7, an amplitude of the thickness-shear mode bulk wave is reversed in a direction between a first region 451 included in the excitation region C in the piezoelectric layer 2 and a second region 452 included in the excitation region C. FIG. 7 schematically shows the bulk wave when a voltage whose electric potential is higher at the electrode 4 than at the electrode 3 is applied between the electrode 3 and the electrode 4. Of the excitation region C, the first region 451 is between a virtual plane VP1 and the first main surface 2a, with the virtual plane VP1 being orthogonal or substantially orthogonal to the thickness direction of the piezoelectric layer 2 and dividing the piezoelectric layer 2 into two. Of the excitation region C, the second region 452 is between the virtual plane VP1 and the second main surface 2b.

In the acoustic wave device 1, as described above, at least one pair of electrodes including the electrode 3 and the electrode 4 are disposed. It is noted that the number of pairs of electrodes made up of the electrodes 3, 4 is not required to be two or more because the acoustic wave device is not designed to propagate waves in the X-direction. In other words, the acoustic wave device is satisfactory as long as at least one pair of electrodes are provided.

The electrode 3 is connected to a hot potential and the electrode 4 is connected to a ground potential, for example. However, the electrode 3 may be connected to the ground potential and the electrode 4 may be connected to the hot potential in an alternative aspect. In the exemplary embodiment, at least one pair of the electrodes, as described above, includes an electrode connected to a hot potential and an electrode connected to a ground potential, and a floating electrode is not provided.

Figure 8:
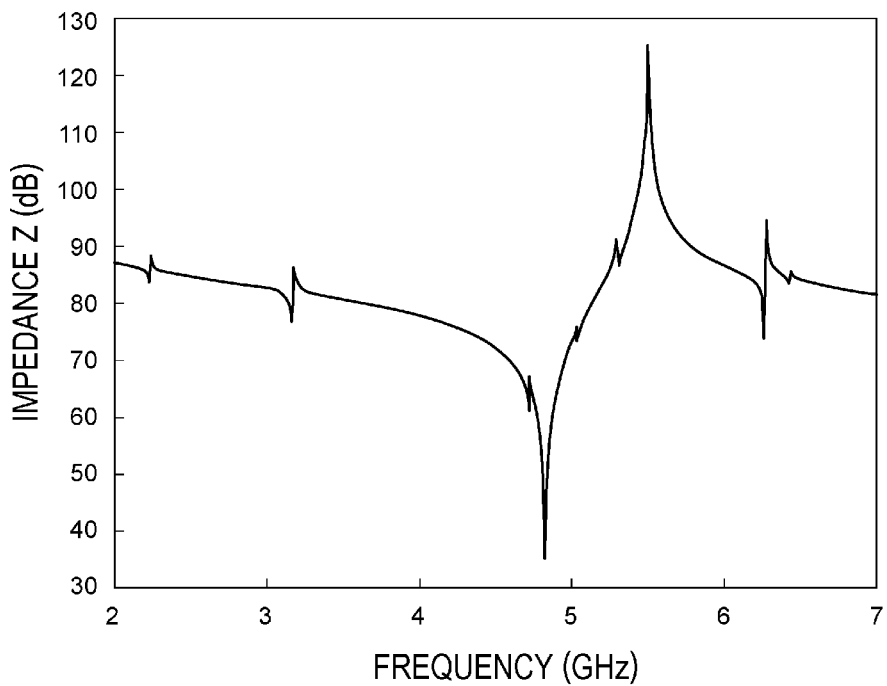
FIG. 8 is a graph showing a resonance characteristic of an acoustic wave device using bulk waves in a thickness-shear mode.

FIG. 8 is a graph showing a resonance characteristic of the acoustic wave device shown in FIG. 5. Parameters designed for the acoustic wave device 1 that displays this resonance characteristic are as described below.

Piezoelectric layer 2: LiNbO$_3$ with Euler angles about (0°, 0°, 90°), thickness=about 400 nm.

Length of the excitation region C, i.e., a region where the electrode 3 and the electrode 4 overlap when viewed in the direction orthogonal or substantially orthogonal to the length direction of the electrode 3 and the electrode 4=about 40 μm, Number of pairs of electrodes made up of the electrodes 3, 4=21, Distance between the centers of the electrodes=about 3 μm, Electrode 3, 4 width=about 500 nm, d/p=about 0.133.

Insulating layer 7: A silicon oxide film with a thickness of about 1 μm.

Support 8: Si.

It is noted that the length of the excitation region C is a dimension of the excitation region C along the electrodes 3, 4 length direction.

In the exemplary embodiment, distances between the plurality of pairs of electrodes including the electrodes 3, 4 are all equal or substantially equal. In other words, the pairs of the electrodes 3 and the electrodes 4 are disposed at equal or substantially equal intervals.

As is clear from FIG. 8, the acoustic wave device, despite not including a reflector, has a satisfactory resonance characteristic with a fractional bandwidth of about 12.5%.

In the present preferred embodiment, as described above, d/p is, for example, less than or equal to about 0.5 and is preferably less than or equal to about 0.24, where d represents the thickness of the piezoelectric layer 2 and p represents the distance between the centers of any pair of electrodes made up of the electrode 3 and the electrode 4. This will be described with reference to FIG. 9.

Figure 9:
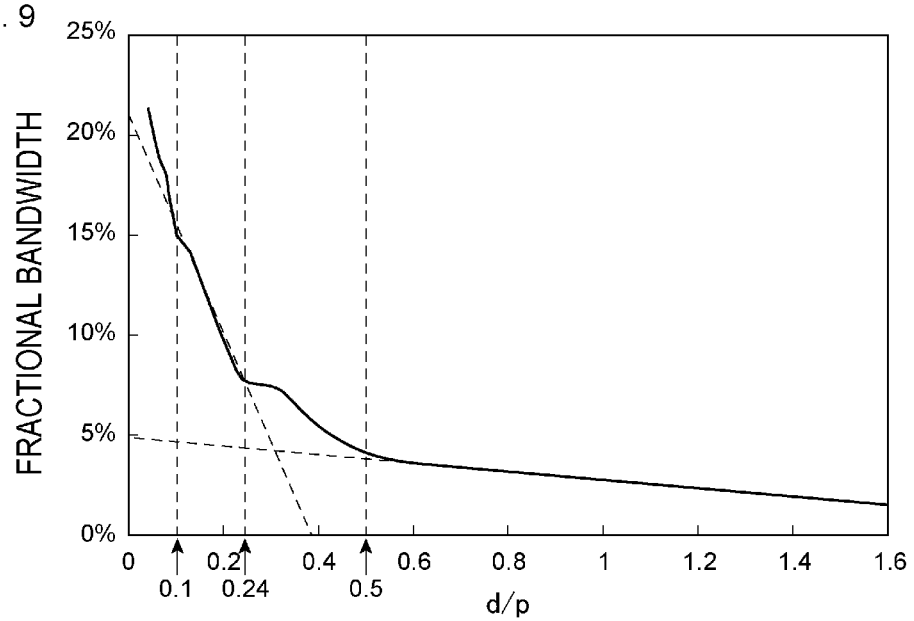
FIG. 9 is a graph showing a relationship between d/p and a fractional bandwidth of resonators where p represents a distance between centers of adjacent electrodes and d represents a thickness of a piezoelectric layer.

In the same or similar way to the acoustic wave device that displays the resonance characteristic shown in FIG. 8, a plurality of acoustic wave devices was prepared with varied d/p values. FIG. 9 is a graph showing a relationship between the d/p and a fractional bandwidth of the acoustic wave devices acting as resonators.

As is illustrated in FIG. 9, when d/p>about 0.5, the fractional bandwidth is less than about 5% although d/p is adjusted. In contrast to that, when d/p is changed within a range of d/p about 0.5, the fractional bandwidth can be greater than or equal to about 5% and in other words, a resonator that has a high coupling factor can be obtained. When d/p is less than or equal to about 0.24, the fractional bandwidth can be increased to about 7% or greater. In addition, when d/p is adjusted within this range, a resonator with a further widened fractional bandwidth can be acquired and a resonator that has a further increased coupling factor can be implemented. Thus, it is observed that when d/p is set to less than or equal to about 0.5, a resonator that has a high coupling factor and that uses bulk waves in the thickness-shear mode can be obtained.

Figure 10:
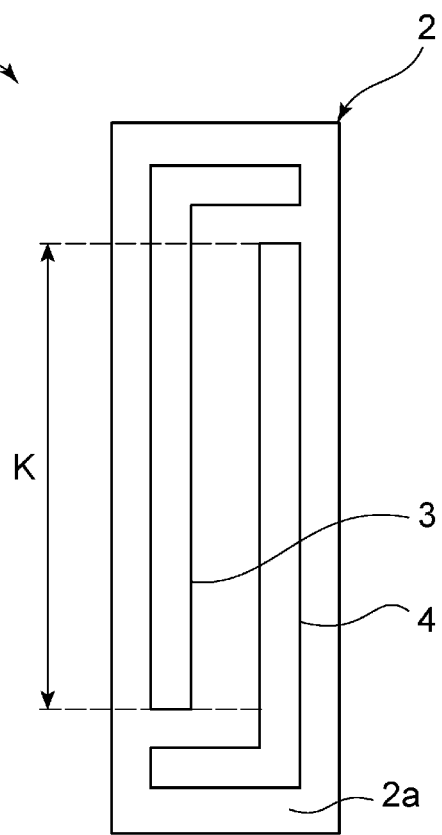
FIG. 10 is a plan view of an acoustic wave device using bulk waves in a thickness-shear mode.

FIG. 10 is a plan view of an acoustic wave device using bulk waves in a thickness-shear mode according to an exemplary aspect. In an acoustic wave device 80, a pair of electrodes including the electrode 3 and the electrode 4 are disposed on the first main surface 2a of the piezoelectric layer 2, although electrodes 3 and 4 can be disposed on a second main surface 2b of the piezoelectric layer 2 in an alternative aspect. In any event, in FIG. 10, K is a cross width. As described above, in an acoustic wave device according to an exemplary embodiment, the number of the pairs of electrodes may be, for example, 1. Even in this case, the acoustic wave device can effectively excite bulk waves in the thickness-shear mode with proviso that the d/p described above is less than or equal to about 0.5.

Figure 11:
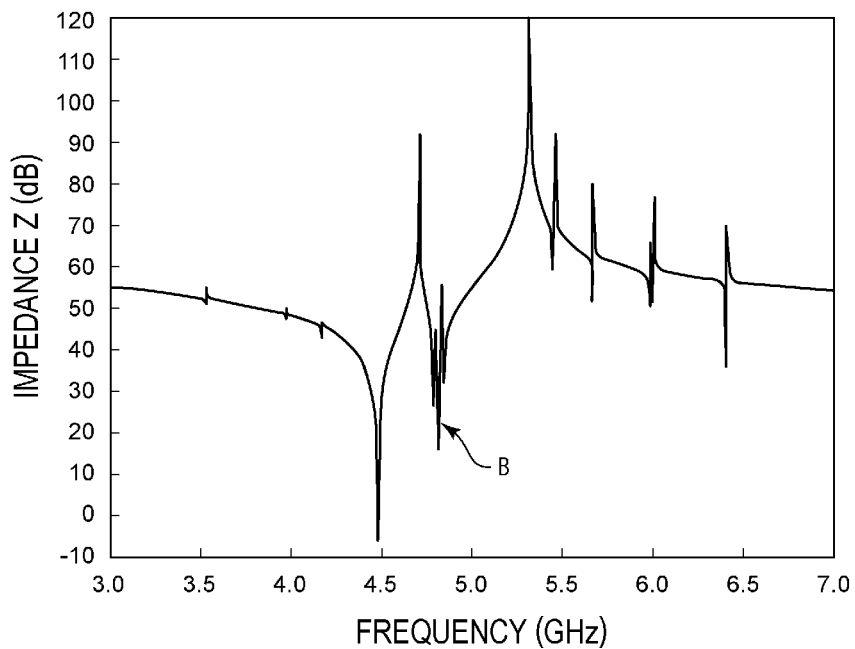
FIG. 11 is a graph showing a resonance characteristic of an acoustic wave device in a reference example where spurious resonance appears.

In the acoustic wave device 1, the excitation region C is a region where any of the adjacent electrodes 3, 4 of the plurality of the electrodes 3, 4 overlap each other in the direction in which the adjacent electrodes 3, 4 are face-to-face. Preferably, the inequality, MR about 1.75(d/p)+0.075, is satisfied where MR is a metallization ratio of the adjacent electrodes 3, 4 to the excitation region C. In this case, spurious resonance can be effectively decreased. This will be described with reference to FIGS. 11 and 12. FIG. 11 is a reference drawing showing an example of a resonance characteristic of the acoustic wave device 1 described above. Spurious resonance indicated with an arrow B is detected between a resonant frequency and an anti-resonant frequency. The parameters are as follows: d/p=about 0.08 and LiNbO$_3$ with Euler angles about (0°, 0°, 90°). The metallization ratio MR was about 0.35.

Metallization ratio MR will be described with reference to FIG. 4B. It is assumed that only one pair of the electrodes 3, 4 are disposed in the electrode structure in FIG. 4B when attention is paid to the pair of the electrodes 3, 4. In this case, a portion surrounded by a dot-and-dash line is the excitation region C. When the electrode 3 and the electrode 4 are viewed in the direction orthogonal or substantially orthogonal to the electrodes 3, 4 length direction, i.e., in the direction in which the electrode 3 and the electrode 4 are face-to-face, the excitation region C includes a region of the electrode 3 overlapping the electrode 4, a region of the electrode 4 overlapping the electrode 3, and a region where the electrode 3 and the electrode 4 overlap each other in a region between the electrode 3 and the electrode 4. Moreover, areas of the electrodes 3, 4 inside the excitation region C relative to an area of the excitation region C is the metallization ratio MR. In other words, the metallization ratio MR is a ratio of an area of a metallization portion to the area of the excitation region C.

It is noted that if a plurality of pairs of electrodes are provided, the MR can be defined as a proportion of a metallization portion included in all of excitation regions to a total of areas of the excitation regions.

Figure 12:
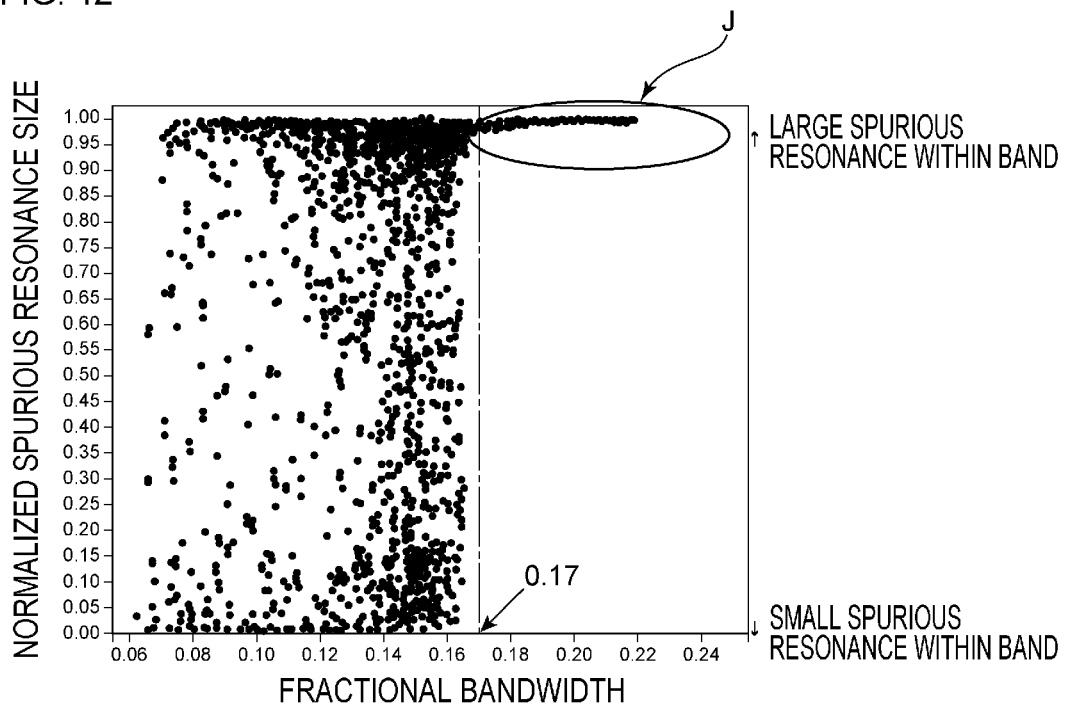
FIG. 12 is a graph showing a relationship between a fractional bandwidth and a phase rotation amount of impedance of spurious resonance that is regarded as a size of spurious resonance normalized by about 180 degrees.

FIG. 12 is a graph showing a relationship between a fractional bandwidth and a phase rotation amount of impedance of spurious resonance that is regarded as a size of spurious resonance normalized by about 180 degrees on a condition that a large number of acoustic wave resonators are configured according to the exemplary embodiment. It is noted that the fractional bandwidth was adjusted by varying the thickness of the piezoelectric layer and dimensions of the electrodes. FIG. 12 shows results obtained when the piezoelectric layer that is made of $LiNbO_3$ and that has a Z-cut angle is used. Even if a piezoelectric layer that has another cut angle is used, a similar tendency is displayed.

In a region surrounded by an ellipse J in FIG. 12, the spurious resonance is large and is measured at about 1.0. As illustrated in FIG. 12, when the fractional bandwidth exceeds about 0.17, i.e., about 17%, large spurious resonance with a spurious level of about 1 or greater appears within a passband even if parameters making up the fractional bandwidth are varied. In other words, as with the resonance characteristic shown in FIG. 11, large spurious resonance indicated with the arrow B appears within the band. Thus, it is preferable that the fractional bandwidth is less than or equal to about 17%, for example, according to the exemplary aspect. In this case, spurious resonance can be decreased by adjusting parameters such as the thickness of the piezoelectric layer 2 and the dimensions of the electrodes 3, 4.

Figure 13:
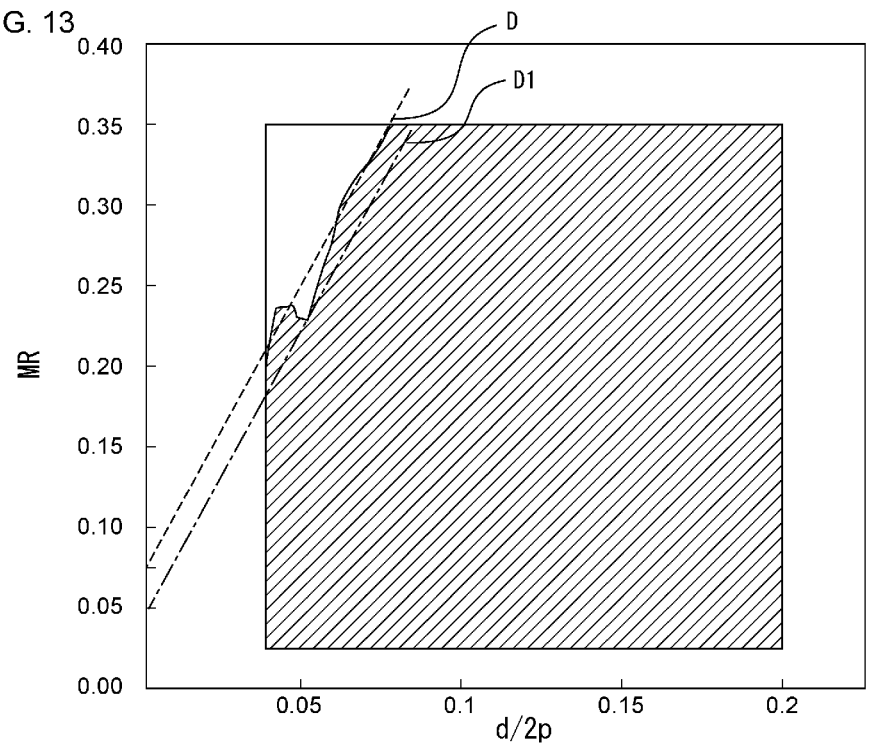
FIG. 13 is a graph showing a relationship between d/2p and metallization ratio MR.

FIG. 13 is a graph showing a relationship between d/2p, metallization ratio MR, and a fractional bandwidth. According to the acoustic wave device described above, various acoustic wave devices with different d/2p and MR values were configured to measure the fractional bandwidth. In FIG. 13, an area hatched on a right side of a dashed line D is a region where the fractional bandwidth is less than or equal to about 17%. A boundary between the hatched region and a region not hatched is represented by MR=about 3.5(d/2p)+0.075. In other words, MR=about 1.75(d/p)+0.075. Thus, it is preferable that MR about 1.75(d/p)+0.075, for example. In this case, the fractional bandwidth can be readily adjusted to about 17% or less. More preferably, the fractional bandwidth is within a region on a right side of a boundary of MR=about 3.5(d/2p)+0.05 indicated by a dot-and-dash line Dl in FIG. 13. In other words, if MR about 1.75(d/p)+0.05, the fractional bandwidth can be reliably adjusted to about 17% or less.

Figure 14:
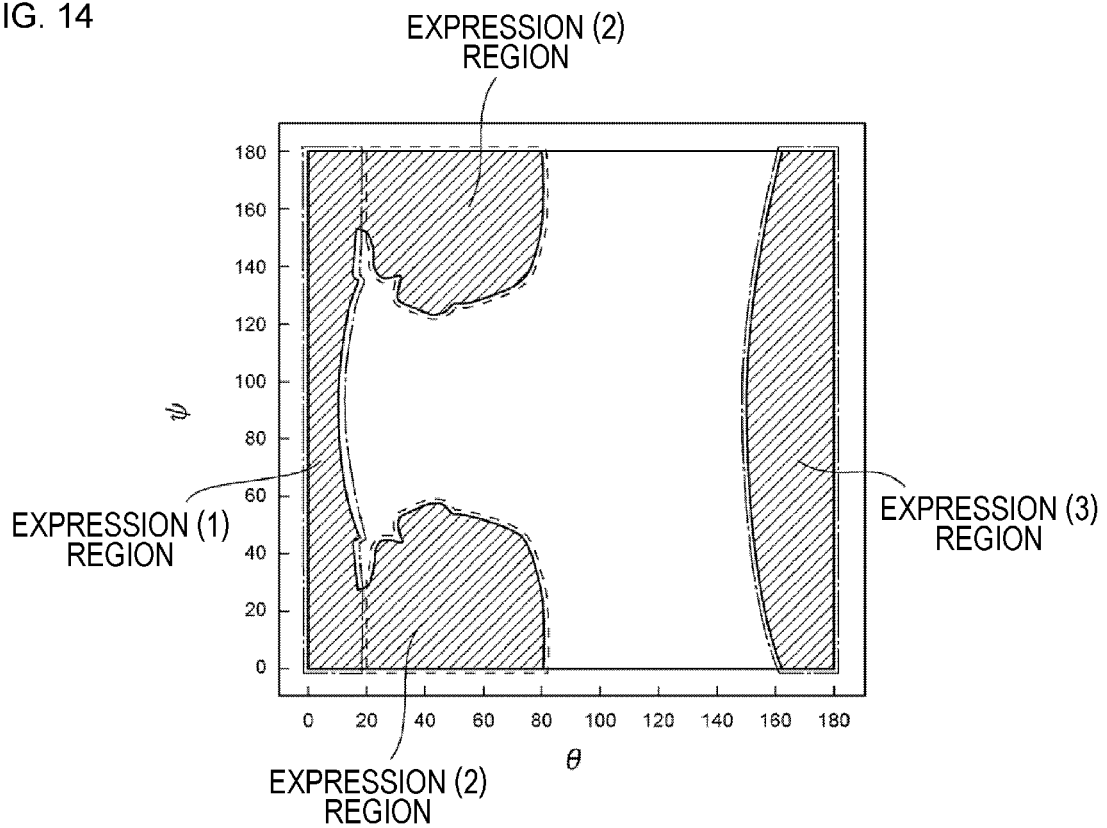
FIG. 14 is a graph showing a map of a fractional bandwidth relative to Euler angles (0°, θ, ψ) of $LiNbO_3$ when d/p gets closer and closer to 0.

FIG. 14 is a graph showing a map of a fractional bandwidth relative to Euler angles (0°, θ, ψ) of $LiNbO_3$ when d/p gets closer and closer to 0. Areas hatched in FIG. 14 are regions in which a fractional bandwidth of at least 5% or greater can be obtained. When ranges of the regions are approximated, the ranges are represented by the following expressions (1), (2), and (3).

$$(0°\pm10°, 0° \text{ to } 20°, \psi \text{ of any value}) \quad (1)$$

$$(0°\pm10°, 20° \text{ to } 80°, 0° \text{ to } 60°(1-(\theta-50)^2/900)^{1/2}) \text{ or } (0°\pm10°, 20° \text{ to } 80°, [180°-60°(1-(\theta-50)^2/900)^{1/2}] \text{ to } 180°) \quad (2)$$

$$(0°\pm10°, [180°-30°(1-(\psi-90)^2/8100)^{1/2}] \text{ to } 180°, \psi \text{ of any value}) \quad (3)$$

Thus, it is preferable that the Euler angles be within any of the ranges represented by the above expressions (1), (2), and (3) to ensure a satisfactory wide fractional bandwidth.

This similarly applies to a case in which the piezoelectric layer 2 is a layer of lithium tantalate, for example.

FIG. 15 is a cross-sectional elevation view of an acoustic wave device including an acoustic multilayer film according to an exemplary embodiment. In an acoustic wave device 41, an acoustic multilayer film 42 is stacked on the second main surface 2b of the piezoelectric layer 2. The acoustic multilayer film 42 (e.g., a Bragg mirror or Bragg reflector) has a layered structure including low acoustic impedance layers 42a, 42c, 42e whose acoustic impedance is relatively low and high acoustic impedance layers 42b, 42d whose acoustic impedance is relatively high. An acoustic wave device that includes the acoustic multilayer film 42 allows bulk waves in the thickness-shear mode to be confined in the piezoelectric layer 2 without including the cavity 9 in the acoustic wave device 1. When d/p, which is described above, is set to less than or equal to about 0.5, the acoustic wave device 41 can also have a resonance characteristic based on bulk waves in the thickness-shear mode. Concerning the low acoustic impedance layers 42a, 42c, 42e and the high acoustic impedance layers 42b, 42d in the acoustic multilayer film 42, a number of layers is not particularly limited. The acoustic multilayer film is satisfactory as long as at least one of the high acoustic impedance layers 42b, 42d is disposed farther from the piezoelectric layer 2 than the low acoustic impedance layer 42a, 42c, 42e is.

Moreover, it is noted that the low acoustic impedance layers 42a, 42c, 42e and the high acoustic impedance layers 42b, 42d may be made of any suitable materials as long as the acoustic impedance relationship described above is satisfied. Examples of the material for the low acoustic impedance layers 42a, 42c, 42e include silicon oxide and silicon oxynitride. Examples of the material for the high acoustic impedance layers 42b, 42d include alumina, silicon nitride, and metal.

It is noted that in the first exemplary embodiment of the present invention or the modification thereof, the acoustic multilayer film 42 shown in FIG. 15 may be provided. An acoustic multilayer film 42 defining and functioning as the first acoustic reflector and an acoustic multilayer film 42 defining and functioning as the second acoustic reflector may be separately provided, for example. Alternatively, a single acoustic multilayer film 42 may define and function as both the first acoustic reflector and the second acoustic reflector.

For acoustic wave devices of the first exemplary embodiment and the modification thereof that include the acoustic wave resonators using bulk waves in the thickness-shear mode, d/p is preferably, for example, less than or equal to about 0.5 and is more preferably less than or equal to about 0.24, as described above. This configuration enables a more satisfactory resonance characteristic. Further, the acoustic wave devices of the first exemplary embodiment and the modification thereof preferably include the acoustic wave resonators using bulk waves in the thickness-shear mode satisfy MR about 1.75(d/p)+0.075, as described above. In this case, spurious resonance can be reduced with increased reliability.

In acoustic wave devices of the first exemplary embodiment and the modification thereof that include the acoustic wave resonators using bulk waves in the thickness-shear mode, the first functional electrode and the second functional electrode may be a functional electrode that includes one pair of the electrodes shown in FIG. 10.

Preferably, in acoustic wave devices of the first exemplary embodiment and the modification thereof that include the acoustic wave resonators using bulk waves in the thickness-shear mode, the piezoelectric layer is, for example, a layer of lithium niobate or a layer of lithium tantalate. Preferably, Euler angles (φ, θ, ψ) of lithium niobate or lithium tantalate which the piezoelectric layer is made of are within any of the ranges represented by the above expressions (1), (2), and (3). In this case, the fractional bandwidth can be widened satisfactorily.

In general, it is noted that while exemplary embodiments of the present invention have been described above, it is to be understood that variations and modifications will be apparent to those skilled in the art without departing from the scope and spirit of the present invention.

What is claimed:

1. An acoustic wave device comprising:
    a first resonator including:
        a piezoelectric substrate including a piezoelectric layer;
        a first functional electrode on the piezoelectric layer; and
        a first dielectric film on the piezoelectric layer and covering the first functional electrode; and
    a second resonator that includes the piezoelectric layer, the second resonator including:
        a second functional electrode on the piezoelectric layer; and
        a second dielectric film on the piezoelectric layer and covering the second functional electrode,
    wherein the piezoelectric layer includes a first resonator portion and a second resonator portion, a portion of the first resonator being in the first resonator portion, a portion of the second resonator being in the second resonator portion;
    wherein a resonant frequency of the first resonator is lower than a resonant frequency of the second resonator and, in the piezoelectric layer, a thickness of the first resonator portion is greater than a thickness of the second resonator portion, and
    wherein ts1/tp1≤ts2/tp2, where tp1 is the thickness of the first resonator portion, tp2 is the thickness of the second resonator portion, ts1 is a thickness of the first dielectric film, and tp2 is a thickness of the second dielectric film.

2. The acoustic wave device according to claim 1, wherein the first resonator and the second resonator are configured to use a thickness resonance mode.

3. The acoustic wave device according to claim 1, wherein ts1/tp1=ts2/tp2.

4. The acoustic wave device according to claim 1, wherein the first dielectric film of the first resonator and the second dielectric film of the second resonator comprise a same dielectric material.

5. The acoustic wave device according to claim 1, wherein the first dielectric film of the first resonator and the second dielectric film of the second resonator comprise different dielectric materials.

6. The acoustic wave device according to claim 1, wherein the piezoelectric layer comprises lithium tantalate or lithium niobate.

7. The acoustic wave device according to claim 6, wherein the first resonator and the second resonator are configured to use bulk waves in a thickness-shear mode that is a thickness resonance mode.

8. The acoustic wave device according to claim 7, wherein:
    Euler angles (φ, θ, ψ) of the piezoelectric layer are within one of the ranges represented by the following expressions (1), (2), and (3):

$$(0°\pm10°, 0° \text{ to } 20°, \psi \text{ of any value}) \qquad (1);$$

$$(0°\pm10°, 20° \text{ to } 80°, 0° \text{ to } 60°(1-(\theta-50)^2/900)^{1/2}) \text{ or }$$
$$(0°\pm10°, 20° \text{ to } 80°, [180°-60° (1-(\theta-50)^2/900)^{1/2}] \text{ to } 180°) \qquad (2); \text{ and}$$

$$(0°\pm10°, [180°-30°(1-(\psi-90)^2/8100)^{1/2}] \text{ to } 180°, \psi \text{ of any value}) \qquad (3).$$

9. The acoustic wave device according to claim 6, wherein:
    each of the first functional electrode and the second functional electrode includes at least one pair of electrodes, and
    the piezoelectric substrate includes a support and the piezoelectric layer on the support.

10. The acoustic wave device according to claim 9, further comprising a first acoustic reflector and a second acoustic reflector disposed in the support, with the first acoustic reflector overlapping at least a portion of the first functional electrode in a plan view, and the second acoustic reflector overlapping at least a portion of the second functional electrode in the plan view.

11. The acoustic wave device according to claim 10, wherein the first resonator and the second resonator each satisfy a condition where d/p is less than or equal to 0.5, where d represents a thickness of the piezoelectric layer and p represents a distance between centers of adjacent electrodes of the at least one pair of electrodes, respectively.

12. The acoustic wave device according to claim 11, wherein d/p is less than or equal to about 0.24.

13. The acoustic wave device according to claim 11, wherein, in each of the first functional electrode and the second functional electrode, an excitation region is a region where the adjacent electrodes overlap each other in a direction in which the adjacent electrodes face-to-face.

14. The acoustic wave device according to claim 13, wherein MR≤1.75(d/p)+0.075, where MR is a metallization ratio of the at least one pair of the electrodes to the excitation region.

15. The acoustic wave device according to claim 10, wherein each of the first acoustic reflector and the second acoustic reflector is a cavity.

16. The acoustic wave device according to claim 10, wherein each of the first acoustic reflector and the second acoustic reflector are at least one Bragg reflector.

17. An acoustic wave device comprising:
    a first resonator including at least one piezoelectric layer, a first electrode on the at least one piezoelectric layer, and a first dielectric film on the at least one piezoelectric layer and the first electrode; and
    a second resonator including the at least one piezoelectric layer, a second electrode on the at least one piezoelectric layer, and a second dielectric film on the at least one piezoelectric layer and the second electrode,
    wherein the at least one piezoelectric layer includes a first resonator portion tp1 that includes the first resonator and a second resonator portion tp2 that includes the second resonator,
    wherein a thickness of the first resonator portion tp1 is greater than a thickness of the second resonator portion tp2, and
    wherein ts1/tp1≤ts2/tp2, where ts1 is a thickness of the first dielectric film, and tp2 is a thickness of the second dielectric film.

18. The acoustic wave device according to claim 17,
wherein a resonant frequency of the first resonator is lower than a resonant frequency of the second resonator,
wherein the first resonator and the second resonator are configured to use a thickness resonance mode.

19. The acoustic wave device according to claim 17, wherein:
each of the first electrode and the second electrode includes at least one pair of electrodes, and
wherein the first resonator and the second resonator each satisfy a condition where d/p is less than or equal to about 0.5, where d represents a thickness of the at least one piezoelectric layer and p represents a distance between centers of adjacent electrodes of the at least one pair of electrodes, respectively.

20. The acoustic wave device according to claim 19, wherein d/p is less than or equal to about 0.24.

\* \* \* \* \*